United States Patent
Greenberg et al.

(10) Patent No.: US 7,555,417 B2
(45) Date of Patent: Jun. 30, 2009

(54) SELECTIVELY REDUCING THE NUMBER OF CELL EVALUATIONS IN A HARDWARE SIMULATION

(76) Inventors: Steven S. Greenberg, 13565 SW. Hargis Rd., Beaverton, OR (US) 97008; Du V. Nguyen, 12660 SW. Glacier Lily Cir., Tigard, OR (US) 97223; Joseph Rodriguez, 40797 SW. Vandehey Rd., Gaston, OR (US) 97119

( * ) Notice: Subject to any disclaimer, the term of this patent is extended or adjusted under 35 U.S.C. 154(b) by 138 days.

(21) Appl. No.: 11/677,044

(22) Filed: Feb. 20, 2007

(65) Prior Publication Data

US 2007/0157136 A1 Jul. 5, 2007

Related U.S. Application Data

(62) Division of application No. 11/015,491, filed on Dec. 16, 2004, now Pat. No. 7,181,706.

(51) Int. Cl.
*G06F 17/50* (2006.01)
(52) U.S. Cl. .............................. 703/16; 703/13; 703/19; 716/6; 714/724
(58) Field of Classification Search .................. 703/13, 703/14, 16, 18, 19; 716/1, 6, 18; 714/726; 327/13; 713/322; 341/155
See application file for complete search history.

(56) References Cited

U.S. PATENT DOCUMENTS

| | | | |
|---|---|---|---|
| 6,389,379 B1 | 5/2002 | Lin et al. | |
| 2003/0011500 A1* | 1/2003 | Takeuchi et al. | 341/155 |
| 2003/0036893 A1* | 2/2003 | Chen | 703/16 |
| 2003/0083856 A1* | 5/2003 | Yoshimura et al. | 703/18 |
| 2003/0110462 A1* | 6/2003 | Cohn et al. | 716/6 |
| 2003/0225562 A1* | 12/2003 | Singh | 703/19 |
| 2004/0080343 A1* | 4/2004 | Nicolaidis | 327/13 |
| 2004/0083442 A1* | 4/2004 | Arcidiacono et al. | 716/18 |
| 2004/0103330 A1* | 5/2004 | Bonnett | 713/322 |
| 2004/0153926 A1* | 8/2004 | Abdel-Hafez et al. | 714/726 |
| 2005/0144580 A1* | 6/2005 | Berkram et al. | 716/6 |
| 2006/0117274 A1* | 6/2006 | Tseng et al. | 716/1 |

OTHER PUBLICATIONS

Razdan et al., "Exploitation of Periodicity in Logic Simulation of Synchronous Circuits." *Proceedings of the International Conference on Computer Aided Design*, 1990.

(Continued)

*Primary Examiner*—Paul L Rodriguez
*Assistant Examiner*—Kandasamy Thangavelu
(74) *Attorney, Agent, or Firm*—Klarquist Sparkman, LLP

(57) ABSTRACT

An electrical circuit comprising a plurality of cells can be simulated to produce simulation results by sorting cells between active status cells and inactive status cells and reducing the processing of simulation results from inactive cells to thereby save simulation time.

25 Claims, 7 Drawing Sheets

OTHER PUBLICATIONS

Takamine et al., "Clock Event Suppression Algorithm of Velvet and its Application to S-820 Development." *Proceedings of the 25th ACM/IEEE Conference on Design Automation*, Jun. 1988.

Ulrich, "A Design Verification Methodology Based on Concurrent Simulation and Clock Suppression." *Proceedings of the Twentieth Design Automation Conference*, Jun. 1983.

Ulrich et. al., "Design Verification for Very Large Networks Based on Concurrent Simulation and Clock Suppression." *IEEE International Conference on Computer Design (ICCD)*, Jun. 1983.

Ulrich, "Exclusive Simulation of Activity in Digital Networks." *Communications of the ACM*, vol. 12 Issue 2, Feb. 1969.

Ulrich and Hebert, "Speed and Accuracy in Digital Network Simulation Based on Structural Modeling." *Proceedings of the Nineteenth Design Automation Conference*, Jun. 1982.

Weber et al., "High Performance Simulation Techniques for Digital Systems: Periodic Signal Suppression in a Concurrent Fault Simulator." *Proceedings of the Conference on European Design Automation*, Feb. 1991.

* cited by examiner

SOFTWARE 780 FOR SIMULATION

US 7,555,417 B2

SELECTIVELY REDUCING THE NUMBER OF CELL EVALUATIONS IN A HARDWARE SIMULATION

CROSS REFERENCE TO RELATED APPLICATIONS

This application is a divisional application of U.S. patent application Ser. No. 11/015,491, filed Dec. 16, 2004 now U.S. Pat. No. 7,181,706.

TECHNICAL FIELD

The technical field relates generally to simulation software and methods used to simulate hardware such as integrated circuits.

BACKGROUND

Simulation has traditionally been the preferred means for validating a circuit. Simulation usually entails analyzing the circuit response to a set of input stimuli over a certain time interval. Simulation can be performed at different levels. At the geometrical level of abstraction, circuits can be modeled as an interconnection of electronic devices (e.g., transistors) and parasitics (e.g., resistance and capacitance). Circuit-level simulation corresponds to deriving the voltage levels at certain circuit nodes as a function of time. Logic-level simulation is the analysis of the functionality of a circuit in terms of logic variables. Functional-level simulation corresponds to simulating HDL or other models of digital circuits.

A designer can simulate a model of a circuit under development together with models of other previously designed (or off-the-shelf) circuits. In other words, simulation allows a designer to validate a circuit in its environment. While there have been various breakthroughs in simulation technology over the years, simulators usually operate with a great number of inefficiencies. For example, hardware simulators routinely execute the evaluation of many cells whose outputs are not going to change for a certain period of time. This unnecessary evaluation results in the waste of large amounts of processing time. Furthermore, in large designs, the mere accessing or updating of information about a cell that does not need to be re-evaluated can cause memory cache misses. This also results in the waste of large amounts of processing time.

Thus, there exists a need for improvements to simulation technology.

SUMMARY

Various exemplary methods for hardware simulation are disclosed together with related apparatus. The methods can be used, for example, to simulate an integrated circuit for testing purposes.

In one aspect, a hardware simulator sorts cells into active and inactive cells to reduce the evaluations made during a simulation (e.g., evaluations of cells that are inactive can be eliminated).

In accordance with another aspect, a potential clock signal or source is identified for a cell. Exemplary approaches are disclosed for identifying the potential clock signal (which is typically the actual fastest clock for the cell) from candidate potential clock signals. Cells may be sorted between active status and inactive status cells depending upon the occurrence of changes in outputs, inputs, or internal states of the cells relative to signals from the potential clock. For example, a cell may be designated as inactive if there are no changes in an output or internal state of the cell for at least two edge transitions of the identified potential clock signal, and a cell may be identified as active upon any occurrence of a change to an input other than the potential clock signal.

Various approaches for monitoring and tracking cell status and status changes from active to inactive and from inactive to active are disclosed herein.

In one specific example, a hardware simulator includes an array (e.g., a megacell) that comprises first and second sub-arrays and that desirably consists of two sub-arrays. One of the first and second sub-arrays desirably contains pointers to cells in a hardware configuration under test that are deemed active. Another of the first and second sub-arrays desirably contains pointers to cells in the hardware configuration that are deemed inactive. When one of the active cells becomes inactive, or when one of the inactive cells becomes active, the array can, for example, be manipulated or changed (e.g., placing the inactive cell in with a sub-array of active cells) to reflect this change in the hardware configuration under test.

Additionally, where a common delay exists between a signal (e.g., a clock signal) and two or more cells, the delay can be merged into a single delay.

Application of the disclosed technology is beneficial because it can speed up simulation and reduce or avoid memory cache misses by reducing the accessing or updating of information about cells that do not need to be re-evaluated.

Any of the disclosed embodiments may be performed by a computer programmed with computer-executable instructions stored on a computer-readable medium. In these embodiments, the computer-executable instructions cause the computer to perform any of the disclosed embodiments. Moreover, any of the disclosed embodiments can be used to update or modify circuit design information stored on a computer-readable medium. Accordingly, modified design databases storing circuit designs retimed by the methods described herein are also disclosed. Such methods can be performed, for instance, on a stand-alone workstation or via a network.

These and other features are set forth below with reference to the accompanying figures.

DETAILED DESCRIPTION

Overview

Figure 1:
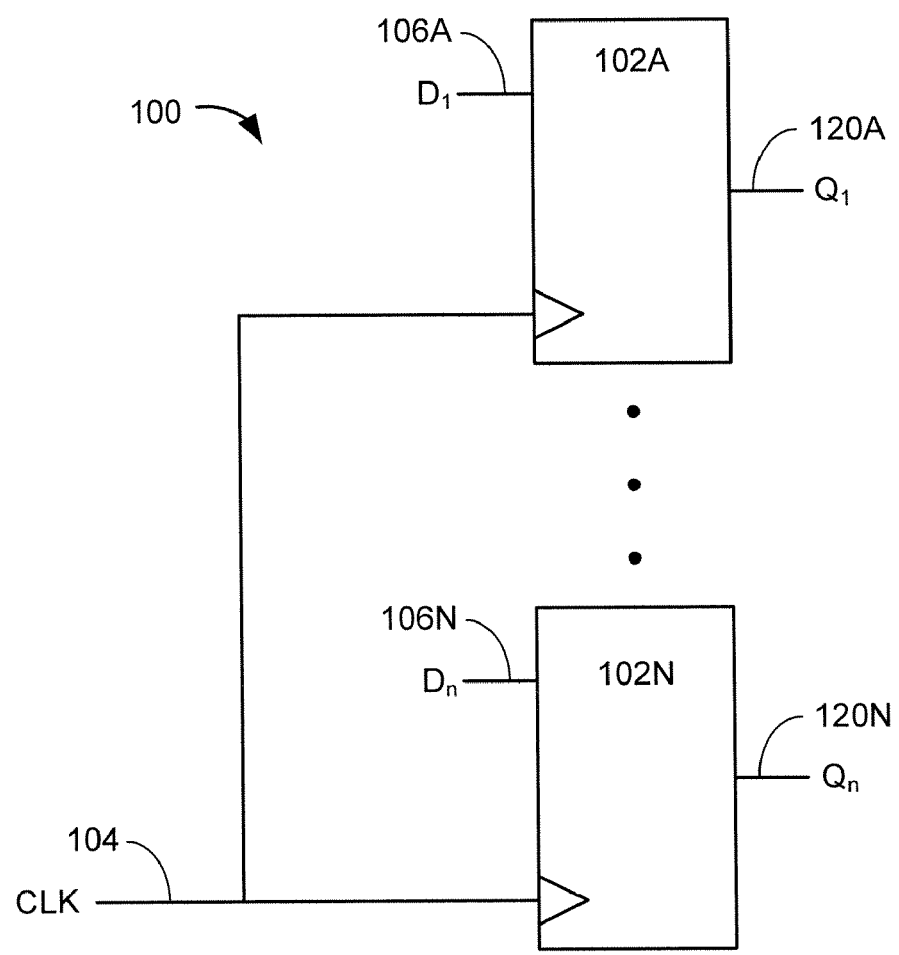
FIG. 1 is a block diagram showing an exemplary hardware configuration.

Disclosed below are representative embodiments of methods for performing hardware simulation. The disclosed methods should not be construed as limiting in any way. Instead, the present disclosure is directed toward novel and non-obvious features and aspects of the various disclosed embodiments, alone and in various combinations and sub-combinations with one another. The methods are not limited to any specific aspect or feature or combinations thereof, nor do the disclosed methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "evaluate" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can, for example, be applied to a wide variety of sequential integrated circuits. A sequential integrated circuit (or sequential circuit) is one whose outputs depend not only on its current inputs, but also on the past sequence of inputs, possibly arbitrarily far back in time. Examples of sequential circuits include programmable logic devices (PLDs) such as field programmable gate arrays (FPGAs), application-specific integrated circuits (ASICs), and systems-on-a-chip (SoCs). A sequential circuit contains at least one sequential circuit element, such as a flip-flop, synchronous RAM element, or latch. A sequential circuit element (or sequential element) generally refers to any circuit element whose outputs state changes occur at times specified by a free-running clock signal.

Any of the disclosed methods can be performed using software stored on a computer-readable medium and executed on a computer. Such software can comprise, for example, an electronic-design-automation (EDA) software tool used, for instance, for logical or physical synthesis. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in detail.

Exemplary Cells

In the present application, the terms "cell" and "cells" are used throughout. Such terms can represent various components of an integrated circuit. For example, a data storage element can be considered a cell for purposes of the disclosed technology.

Exemplary Hardware Configurations

During simulation, integrated circuits often have certain properties that can be taken advantage of to eliminate unnecessary evaluations and memory cache misses. For example, there are often high-frequency, high-fanout signals (e.g., clock, reset, and preset signals) that are inputs to cells for which the data changes at a frequency that is much lower than the clock frequency. In such circuits, once a data input change has been clocked to the output of a cell, the output will usually not change again until there is a non-clock input change. Thus, there can be many changes in the clock input that will not cause a change in the output of the cell. It is therefore desirable to ignore (e.g., not take processing time to evaluate), on each change of the high frequency (e.g., clock) signal, cells having internal states and outputs that do not change with the change of the clock signal. Ignoring such cells generally results in the speeding up of the simulation. Such an increase in simulation efficiency is usually dramatic.

Simulation results can be processed differently for active cells than for inactive cells. For example, such processing can include updating simulation results from active cells of an active cell group while not updating simulation results from inactive cells of an inactive cell group. Alternatively, such processing can include storing simulation results from active cells of an active cell group while not storing simulation results from inactive cells of an inactive cell group. In yet another alternative, such processing can include replaying simulation results from active cells of an active cell group while not replaying simulation results from inactive cells of an inactive cell group.

FIG. 1 is a block diagram showing an exemplary hardware configuration 100. The hardware configuration 100 is comprised of an arrangement of cells 102A-102N. Each cell 102A-102N in this example has two input signals and one output signal $(Q_1\text{-}Q_n)$ 120A-120N. One input signal is a clock (CLK) 104 signal. The second input signal $(D_1\text{-}D_n)$ 106A-106N is a non-clock signal that usually changes much less frequently than the clock signal. The disclosed technology is not limited, however, to devices with only two input signals and one output signal. The following exemplary code can be used in connection with a specific form of the exemplary configuration 100:

```
module Dff( D, clk, Q);
    input D;
    input clk;
    output Q;
    reg Q_reg = 2'b0;
    assign Q = Q_reg;
    always @ ( posedge clk ) begin
        Q_reg = D;
    end
endmodule
```

To better optimize simulation efficiency during simulation of the exemplary configuration 100, the always statement can be modified or eliminated. This can be done by implementing the disclosed technology, because a cell (e.g., 102A) need not be evaluated until a non-clock input signal (e.g., the second input signal 106A) changes. Evaluating the cell on every positive clock edge is unnecessary and inefficient in the example because this example involves a positive clock edge (posedge clk) triggered cell.

Exemplary Megacell

Figure 2:
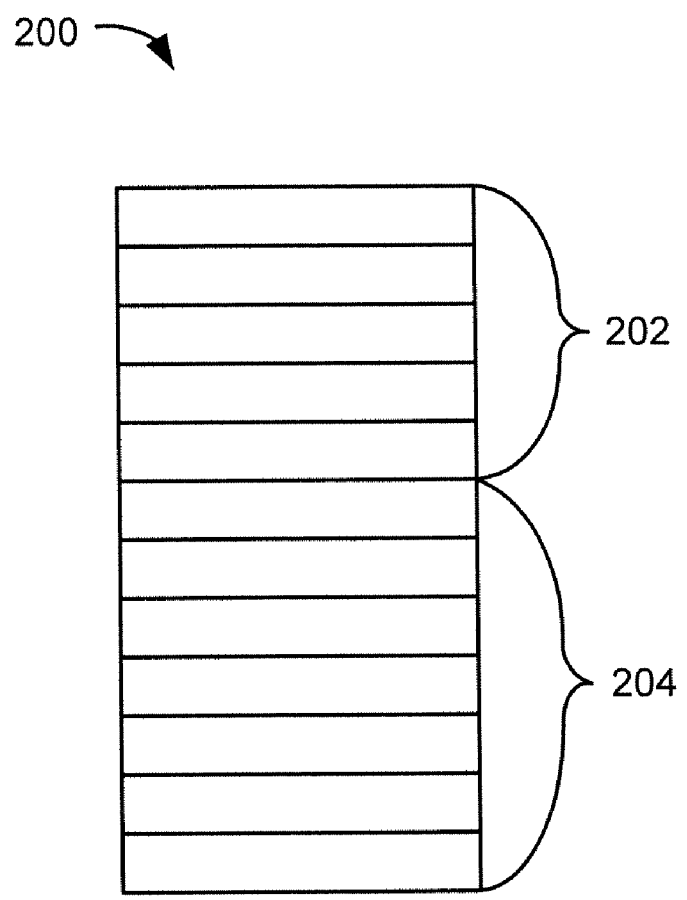
FIG. 2 is a block diagram showing an exemplary megacell.

FIG. 2 is a block diagram showing an exemplary megacell 200 that contains an array of pointers or indices to a collection of cells (e.g., the cells 102A-102N of FIG. 1 above), of which some or all of the cells are connected to at least one high-frequency, high-fanout signal (e.g., a clock signal). When simulating hardware configurations, it may be desirable to have one or more and desirably one megacell for each collection of cells. The megacell 200 can be partitioned, such as into a first sub-array 202 and a second sub-array 204. These sub-arrays 202 and 204 may be the only two sub-arrays or they may comprise a grouping of plural sub-arrays. One sub-array 202 can track cells that are deemed active. Another sub-array 204 can track cells that are deemed inactive. Again, more than one sub-array may be used for each of these purposes. An implementation of the disclosed technology may comprise more than one such megacell. For example, an implementation may comprise one megacell for positive-edge (posedge) clock transitions and another megacell for negative-edge (negedge) clock transitions. Other megacells may also be used for cells that can be grouped as inactive or active depending upon their response to a common input (e.g., one megacell for data elements triggered by signals from a first clock and another megacell for data elements triggered by a separate clock).

When a clock signal (e.g., CLK 104 of FIG. 1 above) changes value between 1 and 0, only a sub-array(s) tracking active cells (e.g., sub-array 202 of FIG. 2) are desirably accessed in one embodiment because active cells are generally the only cells that should be evaluated. Inactive cells can usually be ignored, which means that the sub-array(s) tracking inactive cells (e.g., sub-array 204) need not be considered at this point. If the clock signal makes a transition involving the states X or Z, however, then it may be desirable that all cells are evaluated (e.g., both active and inactive cells). In some cases, an array of pointers (e.g., megacell 200) may be reset, which means that all of its entries are set to inactive status.

Alternatively, a per-process enable/disable flag can be used in place of a partitioned array for certain clock suppression groups. In such cases, like triggered always blocks can be merged so as to minimize the number of processes. Such merging can reduce the number of flags to check on each clock transition and reduce the cost of native code entry, but increase the chance that a process will be enabled.

Exemplary Identification of a Potential Clock

In one embodiment, an input is identified as a potential clock. This can be done by the selection of at least one candidate potential clock from the various inputs to a cell based, for example, on frequency and fanout. Generally, the candidate potential clock with the highest frequency and highest fanout is selected as the potential clock, but the selected potential clock may not always have the highest frequency or highest fanout.

Exemplary Activity of a Cell

As used in the present application, the term "active" (e.g., "active cell") generally refers to a situation in which a cell may or may not be actually active. In other words, the cell can be thought of as potentially active. The term "inactive" (e.g., "inactive cell") generally refers to a situation in which a cell is truly inactive. Simulation efficiency can be significantly increased by processing potentially active cells and selectively not processing inactive cells during a simulation.

Exemplary Activation of an Inactive Cell

When an inactive cell becomes active (e.g., the cell has experienced an input change other than a change in a designated potential clock signal), the megacell can be changed to reflect the new potential activity of the cell. That is, in general, the active cell or cells are sorted to be grouped (e.g., by shifting their pointers or identifiers) with the other active cells. In one specific exemplary approach, the position in the megacell associated with the cell that is becoming active can be swapped with the position associated with the first inactive cell, and the count of active cells can be incremented. For example, FIGS. 3A-D show a megacell 300 partitioned into one section or sub-array containing pointers to active cells 302 and another section or sub-array containing pointers to inactive cells 304.

Figure 3A:
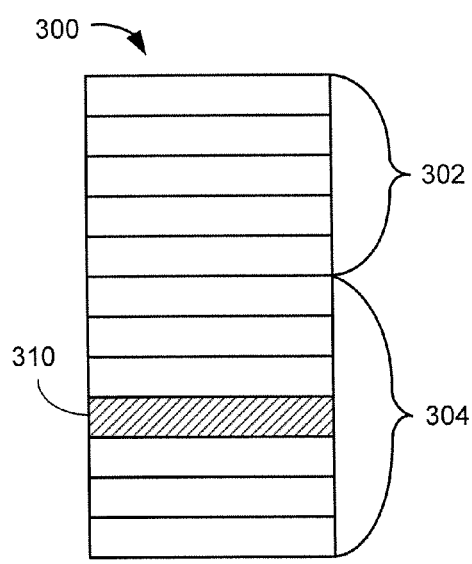
FIGS. 3A-D are block diagrams showing changes in an exemplary megacell corresponding to a cell changing status from inactive to active.
Figure 3B:
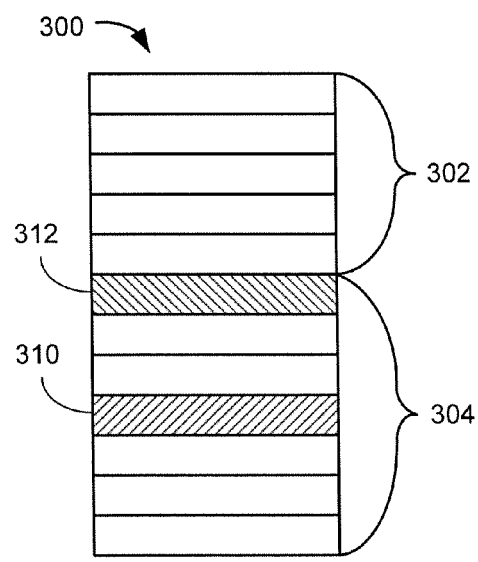
Figure 3C:
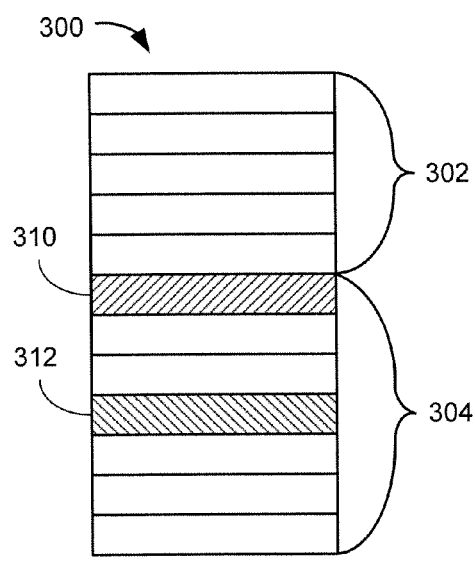
Figure 3D:
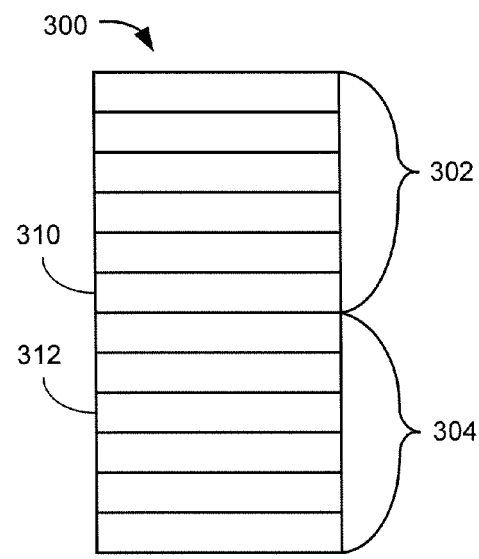

FIG. 3A shows an inactive cell 310 that has now been deemed active (e.g., the cell has experienced an input change other than a change in a designated potential clock signal). In FIG. 3B, the first inactive cell 312 in the inactive section 304 is identified (e.g., using a pointer to the cell). In FIG. 3C, the positions of the pointer corresponding to the newly activated cell 310 and the first inactive cell 312 have been swapped. In effect, the pointer to newly active cell 310 identifies cell 310 as the first cell in the inactive section. FIG. 3D shows the pointer to the activated cell 310 changing from the first entry in the inactive section 304 into the last entry of the active section 302, while the other entry 312 stays in its newly assigned position in the megacell 300. The count of active cells 302 is incremented by one and the count of inactive cells 304 is decremented by one. If more than one cell becomes active from an inactive status at the same time, all of the newly active cells are desirably positioned in the active section group, such as by adjusting their respective pointers.

Exemplary Inactivation of an Active Cell

When an active cell becomes inactive (e.g., the cell has experienced a designated or predetermined number of consecutive clock cycles, transitions, or edges (e.g., at least two edge transitions or at least one clock cycle) with no change in state or output variables), the megacell can be changed to reflect the new inactivity of the cell. In general, the now inactive cell(s) are sorted to be grouped (e.g., by shifting pointers or identifiers) with the other inactive cells. In one specific exemplary approach, the position in the megacell associated with the cell that is becoming inactive can be swapped with the position associated with the most-recently active cell, and the count of active cells can be decremented. For example, FIGS. 4A-D show a megacell 400 partitioned into one section or sub-array containing pointers to active cells 402 and another section or sub-array containing pointers to inactive cells 404.

Figure 4A:
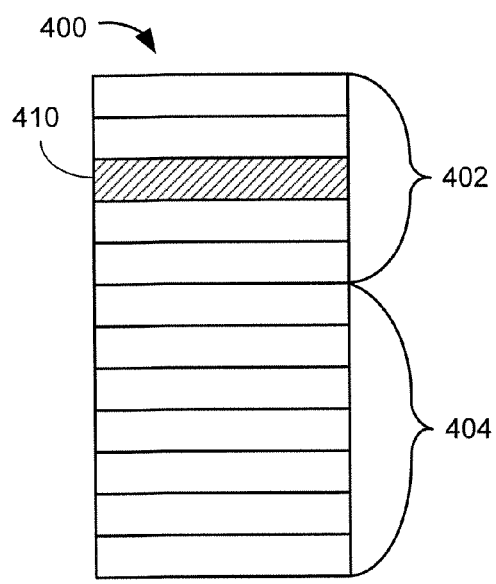
FIGS. 4A-D are block diagrams showing changes in an exemplary megacell corresponding to a cell changing status from active to inactive.
Figure 4B:
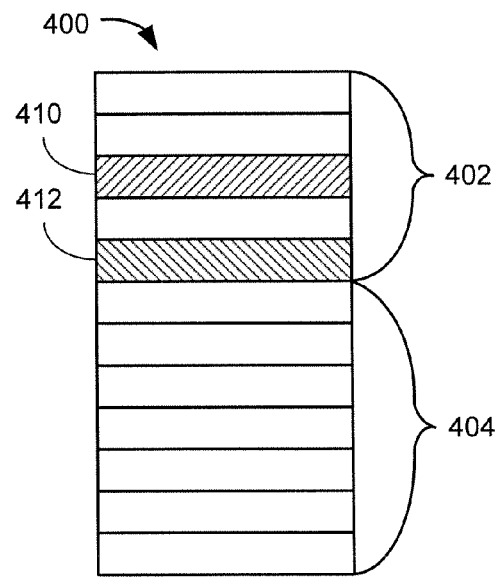
Figure 4C:
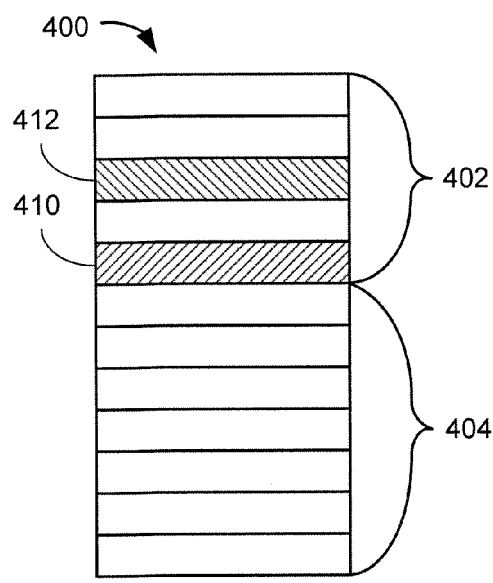
Figure 4D:
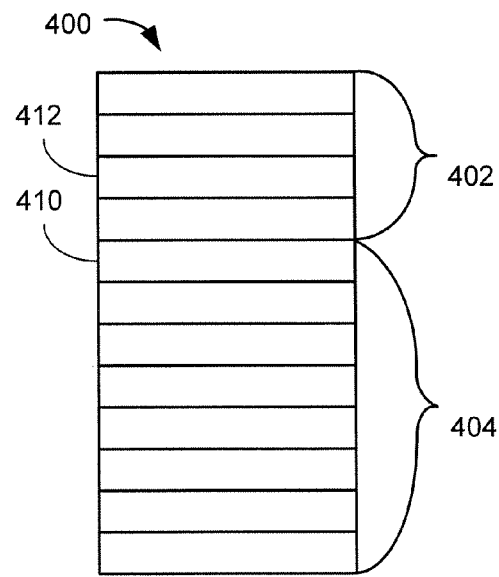

FIG. 4A shows an active cell 410 that has now been deemed inactive (e.g., the cell has not experienced an output or internal state change for a certain number of clock transitions). In FIG. 4B, the last active cell 412 in the active section 402 is identified. In FIG. 4C, the positions of the pointer corresponding to the newly inactivated cell 410 and the last active cell 412 have been swapped. FIG. 4D shows the pointer to the inactivated cell 410 changing from the last entry in the active section 402 into the first entry of the inactive section 404, while the other entry 412 stays in its newly assigned position in the megacell 400. The count of active cells 402 is decremented by one and the count of inactive cells 404 is incremented by one. If more than one cell becomes inactive from an active status at the same time, all of the newly inactive cells are desirably positioned in the inactive section group by adjusting their pointers or identifiers.

Exemplary Identification of a Cell as Active or Inactive

Given a group of cells, each cell generally maintains a record of the time of the last transition on the clock input and the state of the clock. Such information can be used in implementing clock/data race determinacy, path delay, edge and level sensitivity, and timing constraint checks. For example, with respect to timing checks, such information might be needed when the simulator needs to verify that set-up or hold timing constraints are satisfied. In an exemplary implementation of the disclosed technology, a single record is maintained of the last clock transition time and the clock state in a corresponding megacell. When a cell has a non-clock input change and switches from inactive to active, the clock transition time and clock state can be retrieved from the megacell. Thus, the cell would have sufficient data for the simulator to verify the timing constraint while saving processing time.

Knowledge of the inner workings of an individual cell's evaluation routine is generally unnecessary. Knowledge of only the result of the evaluation routine is usually sufficient. A cell can be classified as inactive by monitoring the behavior of an active data cell on a designated or predetermined number (e.g., at least two) of consecutive transitions of the clock signal. Sequences of clock transitions involving any unknown clock signal values need not be considered in one desirable approach. If a cell does not change output or internal state on two (or other) consecutive clock transitions, the cell can be deemed inactive. In one desirable approach, a cell is not classified as inactive unless at least two (and desirably two) consecutive clock edge transitions (or one cycle) have occurred without any change in any of the internal states of the cell and in any of the outputs of the cell.

In one exemplary embodiment of the disclosed technology, an identification of a high-frequency, high-fanout signal can be made. One way to do this is to count the number of cells driven by such a signal. Some signals (e.g., reset signals) that have a high fanout, however, may not change value very frequently. Thus, a determination of a high-frequency signal can be detected either statically at model compilation time or dynamically at model simulation time. A dynamic determination can involve observation of the simulation for a short period of time. Generally, the high-fanout signal that makes a significantly larger number of transitions relative to other high-fanout signals can be considered the clock signal. Some circuits may use more than one clock signal. In such cases, it is often desirable to determine which clock signal is considered the primary clock signal.

In some embodiments, inactive cells in a megacell do not need to be tracked. Rather, when a cell moves from an inactive state to an active state, a pointer to the cell is put at the end of the megacell and the count of active cells is incremented by one. Thus, pointers to the inactive cells do not need to be manipulated. Similarly, when moving a cell from active to inactive, the pointer to the last active cell swaps positions in the megacell with the pointer to the cell being deactivated and the count of active cells is decremented by one. Thus, the pointer to the cell that became inactive is of no importance in such embodiments. In alternative embodiments, active cells in a megacell do not need to be tracked.

Exemplary Distributed Delay of Cells

Figure 5:
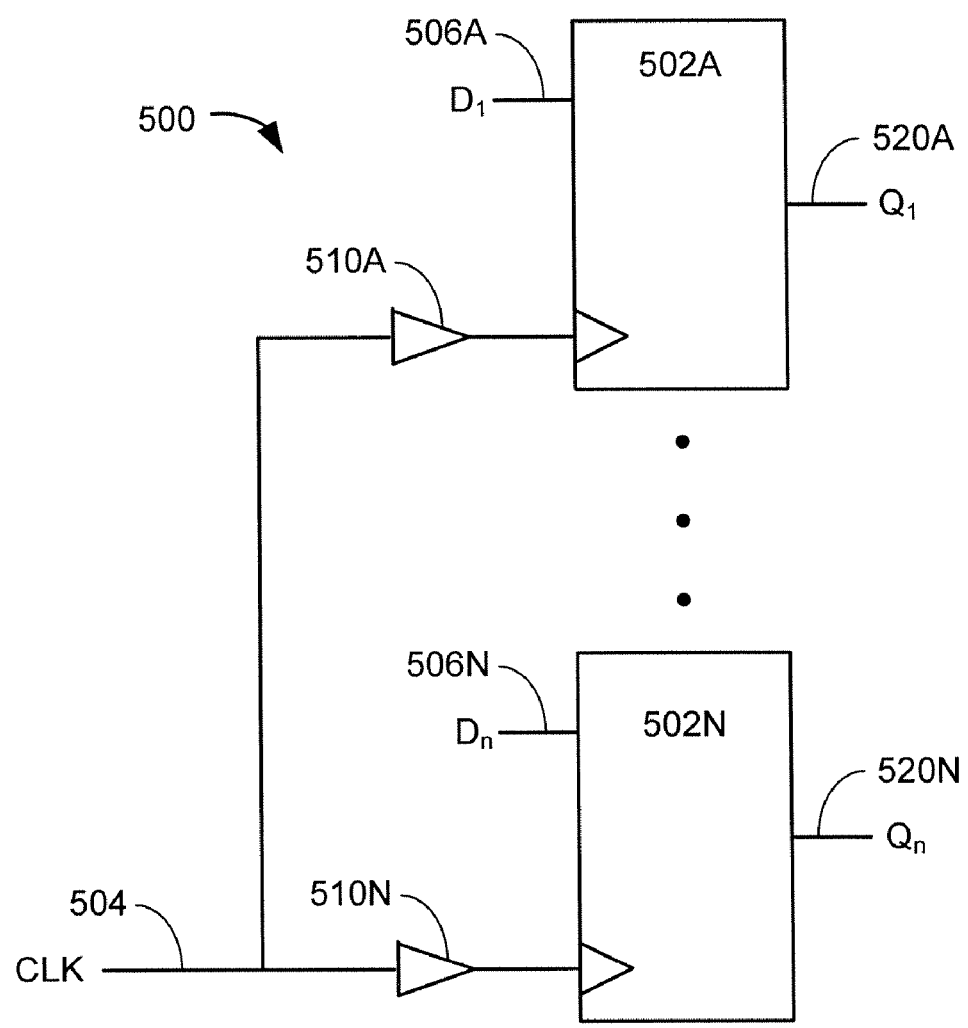
FIG. 5 is a block diagram showing an exemplary arrangement of cells.

FIG. 5 is a block diagram showing an exemplary arrangement 500 of cells 502A-502N, each having two input signals (a clock signal 304 and a non-clock signal ($D_1$-$D_n$) 506A-506N) and an output signal ($Q_1$-$Q_n$) 520A-520N. The arrangement 500 also includes delay elements 510A-510N of varying delay values between the system clock signal (CLK) 504 and the clock terminal of each cell 502A-502N. Inaction with respect to compensation for any of the delay elements 510A-510N could result in errors in the timing of awakening inactive cells in relation to the clock transition events.

Figure 6:
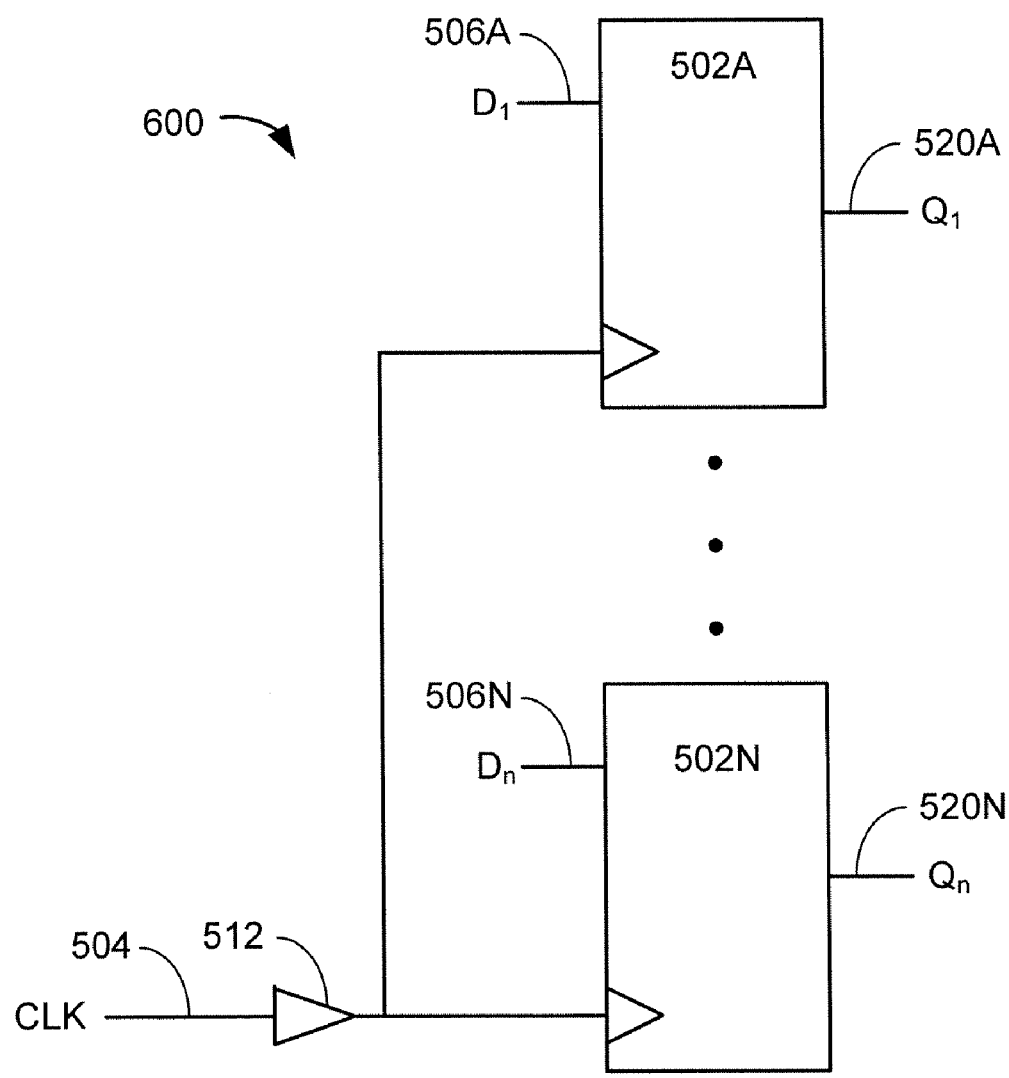
FIG. 6 is a block diagram showing a revised arrangement of the exemplary arrangement of FIG. 5.

Rearrangement of the model topology of arrangement 500 can result in the revised arrangement 600, shown in FIG. 6. In the revised arrangement 600, cells (e.g., cells 502A-502N) that have a substantially similar (e.g., identical, common, or within a desirable or predetermined threshold) delay relative to the CLK 504 can be grouped together (usually plural subsets of elements 502A-502N being grouped in separate groups with each element of each subset having a common delay) and the common delay can be factored out into a single delay element 512. In the exemplary implementation, the single delay element 512 is now closer (e.g., electronically, or physically) to the input signal (e.g., the source of the input signal) than either of the delay elements 510A-510N prior to their merging into the single delay element 512. A suppression algorithm, such as the exemplary clock suppression algorithm described below, can then be applied to the cells 502A-502N that fanout from the new common delayed version of the CLK 504.

Exemplary Clock Suppression Algorithm

In one embodiment of the disclosed technology, an algorithm can be used to perform such functions as identifying a potential clock, creating and manipulating a megacell, identifying a cell as active or inactive, and changing a cell's classification from active to inactive or from inactive to active. One skilled in the art can appreciate that the algorithm described herein is only one of many various types of algorithms that can be used to implement the disclosed technology.

In the pseudo-code below, references to "clock," "actual clock," etc. are references to a candidate potential clock or potential clock and should not be limited to an actual clock. In some embodiments, the potential clock is indeed an actual clock signal, but such is not always the case. In some embodiments, the potential clock is not an actual clock signal, but rather another input signal with high frequency and high fanout.

Described in this example is an exemplary clock suppression algorithm. Such an algorithm may be represented by the pseudo-code disclosed in this section, including the following embodiment of a first routine ClockSuppression:

```
ClockSuppression( )
{
    ClockSignal *clockSignalPointer =
        IdentifyHighFrequencyHighFanoutSignals( );
    if ( clockSignalPointer ) {
        ConstructMegacellsOfDataStorageElements( );
    }
}
```

In the example, the routine ClockSuppression calls a second routine IdentifyHighFrequencyHighFanoutSignals, one embodiment of which is as follows:

```
ClockSignal *IdentifyHighFrequencyHighFanoutSignals( )
{
    ClockSignal *clockSignalPointer
    Determine the maximum number of fanouts for a single signal.
    Make a list of all signals with the maximum fanout.
    For each signal in the list, set its transition count to
            zero.
    Simulate until one of the transition counts reaches a
            predetermined limit.
    Find the signals in the list that have more transitions than a
            predetermined fraction of the predetermined limit.
    if ( list contains only one signal ) {
        clockSignalPointer = pointer to the signal with transitions
            equal to the predetermined limit
    }
    else {
        clockSignalPointer = NULL;
    }
}
```

In the example, the routine identifies signals with high fanout, sets up transition counters on the high fanout signals, simulates until one of the transition counters reaches a certain threshold or predetermined limit (e.g., 100), and uses the gathered transition counts to determine which of the high fanout signals are of high frequency. Thus, signals with both high fanout and high frequency can be determined.

In the example, the routine ClockSuppression then calls a third routine ConstructMegacellsOfDataStorageElements, one embodiment of which is as follows:

```
ConstructMegacellsOfDataStorageElements( )
{
    foreach simNet that has an optimized cell on its fanout {
        Compute the cell groups of all the fanouts on the simNet;
        Make the group triggers for the cell groups;
        Move the triggers from the fanout of the simNet to the
            group;
        Add the group triggers to the simNet;
    }
}
```

In the example, the routine computes cell groups and manipulates (e.g., makes, moves, and adds) triggers corresponding to the cell groups.

The exemplary clock suppression algorithm also includes a fourth routine HandleMegacellMemberNonclockInputChange, one embodiment of which is as follows:

```
HandleMegacellMemberNonclockInputChange( )
{
    if ( cell had been inactive ) {
        Set the cell's state;
        Put the pointer to the cell into the megacell's array of
            pointers to active cells at one position past the last
            active cell;
        Increment the count of the number of active cells in the
            array;
    }
    Set the number of clock transitions left to count before
            deeming the process inactive to 2;
    if ( cell is not sensitive to this edge of the clock ) {
        Update the cell's state;
    }
    else {
        Evaluate the cell;
        if ( cell's output has changed ) {
            Queue the process for fanout evaluation;
            Remember the process's new output value;
        }
    }
}
```

In the example, the routine handles a cell that had been inactive, by setting the cell's state, activating a cell, and setting the number of clock transitions left to count before deeming the process inactive to a certain value (e.g., 2). Activating a cell can include establishing an association with the cell in the active part of an array and incrementing a count of active processes. In the example, the routine also handles a cell that is not sensitive to the particular clock edge, by setting the cell's state. The routine also handles a cell that is sensitive to the particular clock edge by evaluating the cell and handling a cell whose output value has changed. Such handling can include queuing a process for fanout evaluation and remembering the process's new output value.

The exemplary clock suppression algorithm also includes a fifth routine EvaluateTransitionOnClockInputOfTheMegacell, one embodiment of which is as follows:

```
EvaluateTransitionOnClockInputOfTheMegacell( )
{
    if ( we are in dynamic clock detection phase ) {
        Increment count of transitions on this candidate potential
            clock;
        if ( transition count has reached the threshold ) {
            Initialize the local flag to indicate that this is the
                clock;
            foreach ( process that fans out from this candidate
                    potential clock
                ) {
                if ( cell belongs to a megaCell and it is not this
                        megaCell ) {
                    Mark this megaCell as not being a mega-Clock cell;
                    Set local flag that we are no longer counting
                        transitions;
                    Set local flag that we are not suppressing events;
                    Set local flag to indicate that this is not the clock;
                    Break out of loop;
                }
            }
            if ( local flag indicates that this is the clock ) {
                foreach ( process that fans out from this candidate
                        potential clock ) {
                    Make the process's megaClock pointer point to this
                        clock;
                    Set the number of clock transitions left to count
                        before deeming the process inactive to 2;
                }
                Set the megaClock flag that indicates it is no longer in
                    the dynamic clock detection phase;
                Set the megaClock flag that indicates that it is an
                    actual clock group that suppresses events;
                Set local flag that we are no longer counting
                    transitions;
                Set local flag that we are suppressing events;
                Set the size of the active portion of the process
                    pointer array to be the complete set of processes
                    fanning out from the clock
            }
        }
    }
    if ( local flag indicates we are not suppressing events ) {
        foreach ( process that fans out from the clock ) {
            if ( process's megaClock pointer is set to an actual
                    clock ) {
                if ( process had been inactive ) {
                    Set the cell's state from the megaClock's record of
```

-continued

```
            state;
        Put the pointer to the cell into the megacell's
            array of pointers to active cells at one
            position past the last active cell;
        Increment the count of the number of active cells in
            the array;
        }
        Set the number of clock transitions left to count
            before deeming the process inactive to 2;
        }
        if ( cell is not sensitive to this edge of the clock ) {
            Update the cell's state;
        }
        else {
            Evaluate the cell;
            if ( cell's output has changed ) {
                Queue the process for fanout evaluation;
                Remember the process's new output value;
            }
        }
    }
}
else { /* local flag indicates we are suppressing events */
    foreach ( active process that fans out from this clock )
    {
        if ( cell is not sensitive to this edge of the clock ) {
            Set the clock level in the cell's state word.
        }
        else {
            Evaluate the cell;
            if ( cell's output has not changed ) {
                if ( cell's state has not changed and the clock is
                    not in a transition relating to X or Z ) {
                    Decrement the cell's count of the number of clock
                        transitions left to count before deeming the
                        process inactive;
                    if ( number of clock transitions left to count has
                        gone to zero ) {
                        /* Inactivate the cell */
                        Decrement the megaClockCell's count of active
                            cells;
                        if ( cell is in the active part of the clock's
                            cell fanout array ) {
                            Get the pointer to the last active cell in the
                                array;
                            Move that last active to the position of this
                                cell that is being inactivated.
                            Decrement the for loop's index in order to
                                handle the cell that we have just put into
                                the inactive cell's place.
                        }
                    }
                }
                else {
                    Set the number of clock transitions left to count
                        before deeming the process inactive to 2;
                    Queue the process for fanout evaluation;
                    Remember the process's new output value;
                }
            }
        }
    }
}
```

In the example, the routine evaluates all active processes of the megacell. In evaluating an active process, the routine can handle an active process that is not sensitive to the particular clock edge, by setting the process's state, and it can also handle an active process that is sensitive to the particular clock edge by performing a cached evaluation of the process and handling processes whose pending values did or did not change.

In the example, handling processes whose pending value did not change can include handling a process whose internal state did not change and neither the current nor the old value is X or Z, by decrementing the number of clock transitions (or cycles) left to count before deeming the process inactive. The routine can also handle a process with no active states left by inactivating the process. In the example, this can be done by decrementing the count of active processes, swapping the process out of the active part of the array of process pointers, and setting a process array index to work on the process just swapped into the current position in the active part of the array.

In the example, handling processes whose pending value did change can include setting the number of clock transitions left to count before deeming the process inactive to a certain value (e.g., 2), queuing the process for evaluation, and remembering the process's pending value.

Exemplary Computing Environment

Figure 7:
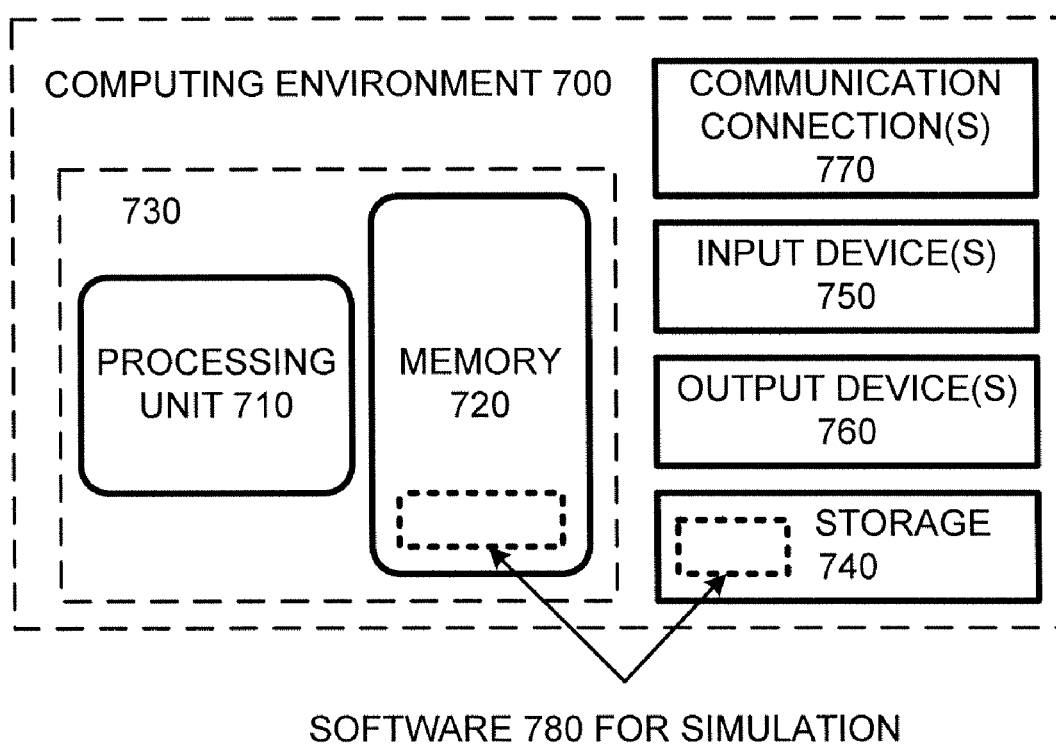
FIG. 7 shows a generalized example of a suitable computing environment in which the described techniques can be implemented.

FIG. 7 illustrates a generalized example of a suitable computing environment 700 in which the described techniques can be implemented. The computing environment 700 is not intended to suggest any limitation as to scope of use or functionality of the disclosed technology, as the disclosed technology may be implemented in diverse general-purpose or special-purpose computing environments.

With reference to FIG. 7, the computing environment 700 includes at least one processing unit 710 and memory 720. In FIG. 7, this most basic configuration 730 is included within a dashed line. The processing unit 710 executes computer-executable instructions and may be a real or a virtual processor. In a multi-processing system, multiple processing units execute computer-executable instructions to increase processing power. The memory 720 may be volatile memory (e.g., registers, cache, RAM), non-volatile memory (e.g., ROM, EEPROM, flash memory, etc.), or other computer-readable media. The memory 720 can store software 780 implementing a simulation tool (e.g., a hardware simulator).

A computing environment may have additional features. For example, the computing environment 700 includes storage 740, one or more input devices 750, one or more output devices 760, and one or more communication connections 770. An interconnection mechanism (not shown) such as a bus, controller, or network interconnects the components of the computing environment 700. Typically, operating system software (not shown) provides an operating environment for other software executing in the computing environment 700, and coordinates activities of the components of the computing environment 700.

The storage 740 may be removable or non-removable, and includes magnetic disks, magnetic tapes or cassettes, CD-ROMs, CD-RWs, DVDs, or any other computer-readable media which can be used to store information and which can be accessed within the computing environment 700. The storage 740 can store software 780 containing instructions for a simulation tool (e.g., a hardware simulator).

The input device(s) 750 may be a touch input device such as a keyboard, mouse, pen, or trackball, a voice input device, a scanning device, or another device that provides input to the computing environment 700. For audio, the input device(s) 750 may be a sound card or similar device that accepts audio input in analog or digital form, or a CD-ROM reader that provides audio samples to the computing environment. The output device(s) 760 may be a display, printer, speaker, CD-writer, or another device that provides output from the computing environment 700.

The communication connection(s) 770 enable communication over a communication medium to another computing entity. The communication medium conveys information such as computer-executable instructions, audio/video or other media information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

Communication media can embody computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. Communication media include wired media such as a wired network or direct-wired connection, and wireless media such as acoustic, RF, infrared and other wireless media. Combinations of any of the above can also be included within the scope of computer readable media.

The techniques herein can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

The technologies from any one or more portions of the above description can be combined. In view of the many possible embodiments to which the principles of the disclosed technology may be applied, it should be recognized that the illustrated embodiments are examples of the disclosed technology and should not be taken as a limitation on the scope of the disclosed technology. Rather, the scope of the disclosed technology includes what is covered by the following claims. We therefore claim as our invention all that comes within the scope and spirit of these claims.

The invention claimed is:

1. A computer implemented method of simulating an integrated circuit comprising a plurality of cells, the method comprising:
   monitoring, using a computer, input signals to the plurality of cells during simulation of the integrated circuit;
   designating, using the computer, at least one input to the plurality of cells as a potential clock signal;
   monitoring, using the computer, activity status of the plurality of cells based on inputs, outputs or internal states of the cells;
   assigning, using the computer, an activity classification to at least one of the plurality of cells, wherein the at least one of the plurality of cells receives the potential clock signal as an input, wherein the assigned activity classification is an inactive status in the event the at least one of the plurality of cells is inactive, and wherein the assigned activity classification is an active status in the event the at least one of the plurality of cells is active; and
   during simulation of the integrated circuit:
   bypassing, using the computer, processing of at least some simulation events from said at least one of the plurality of cells when the assigned activity classification for said at least one of the plurality of cells is inactive; and
   processing, using the computer, simulation events for at least one of the plurality of cells when the assigned activity classification for said at least one of the plurality of cells is active.

2. A method according to claim 1 comprising monitoring the activity status of the at least one of the plurality of cells during the simulation and changing the activity classification of the at least one of the plurality of cells from active status to inactive status or from an inactive status to active status in response to changes in activity status of the at least one of the plurality of cells during the simulation.

3. A method according to claim 2 wherein there is at least one enable/disable flag associated with the at least one of the plurality of cells, and wherein a value of the enable/disable flag represents the activity classification of the at least one of the plurality of cells.

4. A method according to claim 2 wherein there is at least one array corresponding to the plurality of cells, wherein the at least one array comprises a first sub-array associated with a group of active status cells of the plurality of cells and comprises a second sub-array associated with a group of inactive status cells of the plurality of cells, and wherein an association of each of the plurality of cells changes from an association with one of said first and second sub-arrays to the other of said first and second sub-arrays as the activity classification of each of the plurality of cells changes from active to inactive or from inactive to active.

5. The method of claim 2 further comprising assigning the inactive status to the at least one of the plurality of cells if an output and a state of the at least one of the plurality of cells do not change for at least two edges of the potential clock signal and assigning the active status to the at least one of the plurality of cells if any of at least one input other than the clock signal of the at least one of the plurality of cells changes.

6. The method of claim 1 wherein assigning the activity classification to the at least one of the plurality of cells comprises:
   analyzing activity of the at least one of the plurality of cells; and
   assigning the active or inactive status classification to the at least one of a plurality of cells based on the analyzing.

7. The method of claim 6 wherein analyzing activity of the at least one of the plurality of cells comprises monitoring outputs from the at least one of a plurality of cells to determine changes in said monitored outputs.

8. The method of claim 1 wherein designating the at least one input to the plurality of cells as the potential clock signal comprises evaluating a frequency of each of a plurality of candidate potential clock signals and designating the potential clock signal from the plurality of candidate potential clock signals based upon the evaluated frequency of the potential clock signal.

9. The method of claim 8 wherein the plurality of candidate potential clock signals are selected based upon the fanout of signals to the plurality of cells.

10. The method of claim 8 wherein designating the at least one input to the plurality of cells as the potential clock signal comprises designating a signal having a frequency higher than any other of the plurality of candidate potential clock signals as the potential clock signal.

11. The method of claim 1 wherein designating the at least one input to the plurality of cells as the potential clock signal comprises analyzing a fanout characteristic of each of a plurality of signals coupled to some of the plurality of cells and designating one of the plurality of signals coupled to some of the plurality of cells as the potential clock signal if the one of the plurality of signals coupled to some of the plurality of cells has a higher fanout than any other of the plurality of signals coupled to some of the plurality of cells.

12. The method of claim 1, wherein designating at least one input to the plurality of cells as a potential clock signal comprises:
   monitoring a plurality of candidate potential clock signals during a simulation time period;
   counting changes in a signal state of each of the plurality of candidate potential clock signals during said simulation time period; and
   selecting as the potential clock signal one of the candidate potential clock signals that has a greatest number of signal state changes during said simulation time period.

13. The method of claim 1, wherein the at least one input to the plurality of cells designated as the potential clock signal is an input to the plurality of cells that changes most rapidly over an observation time period.

14. The method of claim 1, wherein the at least one input to the plurality of cells designated as the potential clock signal comprises an actual clock signal.

15. The method of claim 14, wherein the at least one input to the plurality of cells designated as the potential clock signal comprises a fastest actual clock signal input to the cell.

16. The method of claim 1, further comprising:
   identifying at least two delay elements each positioned between one of the plurality of cells and at least one input to the plurality of cells;
   determining whether the at least two delay elements represent a substantially similar delay; and
   in response to a determination that the at least two delay elements do represent the substantially similar delay, merging the at least two delay elements into a single delay element for simulation.

17. The method of claim 16, further comprising positioning the single delay element closer to the at least one input than the at least two delay elements prior to merging.

18. One or more computer-readable storage media storing computer-executable instructions which when executed on a computer perform a method of simulating an integrated circuit comprising a plurality of cells, the method comprising:
   monitoring input signals to the plurality of cells during simulation of the integrated circuit;
   designating at least one input to the plurality of cells as a potential clock signal;
   monitoring activity status of the plurality of cells based on inputs, outputs or internal states of the cells;
   assigning an activity classification to at least one of the plurality of cells, wherein the at least one of the plurality of cells receives the potential clock signal as an input, wherein the assigned activity classification is an inactive status in the event the at least one of the plurality of cells is inactive, and wherein the assigned activity classification is an active status in the event the at least one of the plurality of cells is active; and
   during simulation of the integrated circuit:
   bypassing processing of at least some simulation events from said at least one of the plurality of cells when the assigned activity classification for said at least one of the plurality of cells is inactive; and
   processing simulation events for at least one of the plurality of cells when the assigned activity classification for said at least one of the plurality of cells is active.

19. A computer implemented method of simulating an integrated circuit comprising a plurality of cells, the method comprising:
   storing at least one away in memory, wherein the at least one away comprises:
   at least one first sub-array comprising a first plurality of entries corresponding to a first plurality of active cells within the integrated circuit being simulated;
   at least one second sub-array comprising a second plurality of entries corresponding to a second plurality of inactive cells within the integrated circuit being simulated;
   monitoring, using the computer, activity status of the plurality of cells based on inputs, outputs or internal states of the cells;
   manipulating, using the computer, at least one of the sub-arrays based upon a change in activity status of at least one of the plurality of cells from active to inactive or from inactive to active; and
   during simulation of the integrated circuit:
   bypassing, using the computer, processing of at least some simulation events from said at least one of the plurality of cells when the activity status of said at least one of the plurality of cells becomes inactive; and
   processing, using the computer, simulation events for at least one of the plurality of cells when the activity status of said at least one of the plurality of cells becomes active.

20. The method of claim 19, further comprising monitoring active cells only, wherein the manipulating is in response to the monitoring and comprises changing a counter corresponding to how many cells are active.

21. The method of claim 19, further comprising monitoring inactive cells only, wherein the manipulating is in response to the monitoring and comprises changing a counter corresponding to how many cells are inactive.

22. The method of claim 19 wherein the first plurality of entries comprises a first plurality of pointers, the first plurality of pointers corresponding to the first plurality of cells within the integrated circuit being simulated, and wherein the second plurality of entries comprises a second plurality of pointers, the second plurality of pointers corresponding to the second plurality of cells within the integrated circuit being simulated.

23. The method of claim 22 wherein manipulating the at least one of the sub-arrays based upon the change in activity status of the at least one simulated cell comprises maintaining a first count corresponding to a number of entries in the first sub-array and a second count corresponding to a number of entries in the second sub-array;
   upon a change in activity status of the at least one simulated cell from an active status to an inactive status, identifying a last entry in the first sub-array, swapping the last entry in the first sub-array with an entry in the first sub-array corresponding to the at least one simulated cell that has changed from an active status to an inactive status, and decrementing the first count by one and incrementing the second count by one, thereby shifting the entry corresponding to the at least one simulated cell that has changed from an active status to an inactive status from the first sub- array to the second sub-array; and
   upon a change in status of the at least one simulated cell from an inactive status to an active status, identifying a first entry in the second sub-array, swapping an entry corresponding to the at least one simulated cell that has changed from an inactive status to an active status with the first entry in the second sub-array, incrementing the first count by one and decrementing the second count by one, thereby shifting the entry corresponding to the at least one simulated cell that has changed from inactive to active status from the second sub-array to the first sub-array.

24. One or more computer-readable storage media storing computer-executable instructions which when executed on a computer perform a method of simulating an integrated circuit comprising a plurality of cells, the method comprising:

storing at least one away in memory, wherein the at least one away comprises:
at least one first sub-array comprising a first plurality of entries corresponding to a first plurality of active cells within the integrated circuit being simulated;
at least one second sub-array comprising a second plurality of entries corresponding to a second plurality of inactive cells within the integrated circuit being simulated;
monitoring activity status of the plurality of cells based on inputs, outputs or internal states of the cells;
manipulating at least one of the sub-arrays based upon a change in activity status of at least one of the plurality of cells from active to inactive or from inactive to active; and
during simulation of the integrated circuit:
bypassing processing of at least some simulation events from said at least one of the plurality of cells when the activity status of said at least one of the plurality of cells becomes inactive; and
processing simulation events for at least one of the plurality of cells when the activity status of said at least one of the plurality of cells becomes active.

25. A computing system for simulating an integrated circuit comprising a plurality of cells, comprising:

one or more processors;
a memory storing a program of instructions comprising:
a model of a hardware configuration, wherein the hardware configuration comprises the plurality of cells; and
a hardware simulator comprising at least one array, the at least one away comprising:
at least one first sub-array comprising a first plurality of entries corresponding to a first plurality of active cells within the integrated circuit being simulated;
at least one second sub-array comprising a second plurality of entries corresponding to a second plurality of inactive cells within the integrated circuit being simulated;
wherein during simulation of the integrated circuit:
activity statuses of the plurality of cells are monitored based on inputs, outputs or internal states of the cells;
at least one of the sub-arrays is manipulated based upon a change in activity status of at least one of the plurality of cells from active to inactive or from inactive to active; and
processing of at least some simulation events from said at least one of the plurality of cells is bypassed when the activity status of said at least one of the plurality of cells becomes inactive; and
simulation events for at least one of the plurality of cells are processed when the activity status of said at least one of the plurality of cells becomes active.

* * * * *